United States Patent [19]

Gill

[11] Patent Number: 5,162,879
[45] Date of Patent: Nov. 10, 1992

[54] DIFFUSIONLESS CONDUCTOR/OXIDE SEMICONDUCTOR FIELD EFFECT TRANSISTOR AND METHODS FOR MAKING AND USING THE SAME

[75] Inventor: Manzur Gill, Rosharon, Tex.

[73] Assignee: Texas Instruments Incorporated, Dallas, Tex.

[21] Appl. No.: 786,651

[22] Filed: Nov. 1, 1991

Related U.S. Application Data

[62] Division of Ser. No. 505,802, Apr. 6, 1990, Pat. No. 5,063,171.

[51] Int. Cl.$^5$ ............................................. H01L 27/01
[52] U.S. Cl. ..................................... 257/391; 257/401; 257/366
[58] Field of Search ..................... 357/24, 23.11, 23.1, 357/41, 45

[56] References Cited

U.S. PATENT DOCUMENTS 3,902,186  8/1975  Engeler et al. ....................... 357/24

Primary Examiner—Edward J. Wojciechowicz
Attorney, Agent, or Firm—Ronald O. Neerings; Lawrence J. Bassuk; Richard L. Donaldson

[57] ABSTRACT

A diffusionless field effect transistor is formed at a face of a semiconductor layer (12) of a first conductivity type and includes a source conductor (36), a drain conductor (38) and a channel region (44). Source conductor (36) and drain conductor (38) are disposed to create inversion regions, and a second conductivity type opposite said first conductivity type, in the underlying source inversion region (40) and drain inversion region (42) of semiconductor layer (12) upon application of voltage. The transistor has a gate (54) insulatively overlying the channel region (44) to control the conductivity thereof.

19 Claims, 3 Drawing Sheets

DIFFUSIONLESS CONDUCTOR/OXIDE SEMICONDUCTOR FIELD EFFECT TRANSISTOR AND METHODS FOR MAKING AND USING THE SAME

This is a division of application Ser. No. 07/505,802, filed Apr. 6, 1990, now U.S. Pat. No. 5,063,171.

TECHNICAL FIELD OF THE INVENTION

The present invention relates generally to field effect transistors, and more particularly to diffusionless conductor/oxide semiconductor field effect transistors and methods of manufacture and use of such devices.

BACKGROUND OF THE INVENTION

The conductor/oxide semiconductor field effect transistor (MOSFET) has been known in the art for some time. MOSFETs can be used in a variety of applications, most importantly in semiconductor memory devices. The typical MOSFET consists of a substrate of a specified conductivity type with two heavily doped regions, of an opposite conductivity type, formed in its face. The heavily doped regions, designated the drain and the source, are separated by a channel region. A thin oxide layer is on the surface of the channel and a "metal" (typically highly-doped polycrystalline silicon) is deposited on it to form the gate.

In a typical induced channel MOSFET, when the gate is left floating or a very small voltage is applied to the gate, the path between the drain and the source represents two series diodes back to back, which precludes current flow. When an adequate positive voltage is applied at the gate (NMOS), however, electrons are attracted from the substrate and accumulate at the surface beneath the gate oxide layer, inducing a conductive channel between the drain and the source and allowing current to flow. To attract sufficient numbers of electrons to form such a channel, the voltage applied to the gate must be equal to or greater than a threshold value $V_t$.

The formation of the source and drain diffused region requires several steps. A conventional set of these steps includes defining the areas of the substrate in which the diffusion will be performed by depositing and patterning a photoresist on the overlying oxide layer and then etching the exposed oxide away. Then, following definitions of the boundaries of the prospective diffused regions, the actual implant must be made. Thus, by eliminating the need to create the heavily doped diffused source and drain regions, the process of manufacturing similar transistors can be reduced.

The advantages of reduced process steps are greatly magnified when an array, such as a memory array, of MOSFETs is being contemplated. The elimination of the source and drain diffusions (or implants) will allow the array to be more scaleable, with a consequent improvement in memory cell density. Further improvement in cell density can be achieved if adjacent cells can be isolated from each other electrically without intervening physical structure, such as field oxide.

SUMMARY OF THE INVENTION

According to the invention, a source/drain diffusionless field effect transistor is formed at a face of a layer of semiconductor of a first conductivity type. A thin insulator layer is formed overlying the semiconductor. A source conductor is formed on said thin insulator layer to overlie a source inversion region of the semiconductor layer while a drain conductor is formed on the thin insulator layer to overlie a drain inversion region of the semiconductor layer. The source and drain conductors are spaced from each other to define a channel region of the semiconductor layer between the source inversion region and the drain inversion region. A gate conductor overlies the channel region. At least one voltage source is coupled to the drain and source conductors for inverting the source and drain inversion regions to a second conductivity type opposite the first conductivity type of which the semiconductor layer is formed.

In a preferred embodiment, an array of source/drain diffusionless field effect transistors are formed at the face of a semiconductor layer of a first conductivity type. A thin insulator layer is formed overlying the layer of semiconductor. A plurality of parallel, elongated drain conductors are formed overlying the thin insulator layer. For each pair of drain conductors, an elongated source conductor is formed in between and substantially parallel thereto. Each source conductor is spaced from the adjacent drain conductors by a plurality of channel regions. A plurality of elongated gate conductors are formed at an angle to insulatively intersect the source and drain conductors, the gate conductors insulatively disposed adjacent the channel regions such that field effect transistors are formed at least some intersections of the gate conductors with the source and drain conductors and the channel regions.

The present invention presents distinct advantages over prior art MOSFETs. The conventional source and drain diffused regions have been eliminated. Only small diffusions are required to control the voltages of the induced inversion regions. In an array of such transistors, only one small diffusion region is required for every eight or sixteen transistors. Further, the present transistor is self-isolating. When no voltage is applied to the source and/or drain conductors, no inversions are created, and thus, no electrical path can be created between adjacent cells.

BRIEF DESCRIPTION OF THE DRAWINGS

Other aspects of the invention and their advantages will be discerned when one refers to the following detailed description as taken in conjunction with the drawings, in which:

FIG. 2 corresponds to line 2—2 of FIG. 1 while FIGS. 3 through correspond to line 6—6 of FIG. 1;

DETAILED DESCRIPTION OF THE INVENTION

Figure 1:
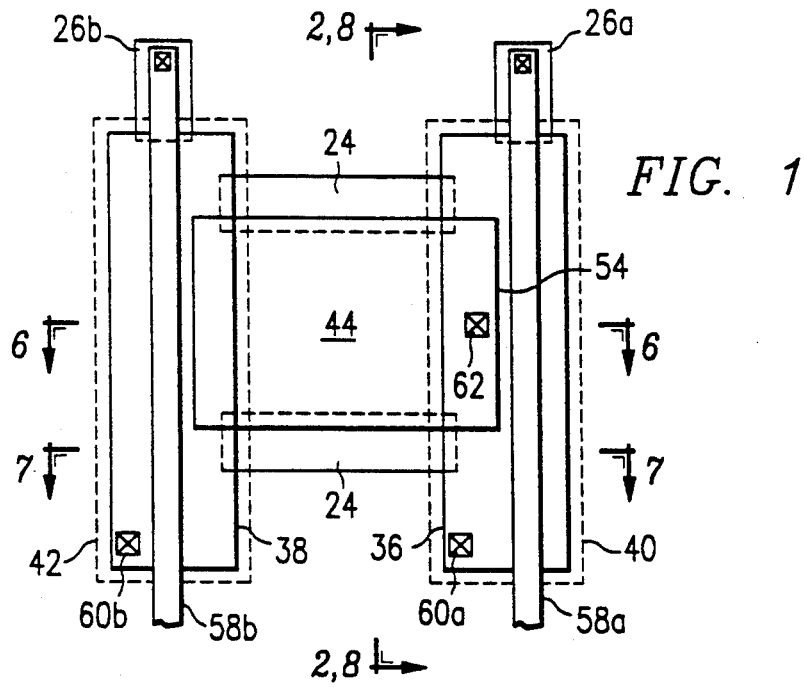
FIG. 1 is a plan view of a diffusionless conductor MOSFET according to the invention.

The fabrication of a diffusionless conductor MOSFET according to the invention will be described first, followed by the operation of such a cell in a memory array. A plan view of a complete diffusionless conductor transistor according to the invention is shown in FIG. 1, selected structure having been omitted for the sake of clarity. The transistor of FIG. 1 includes a source conductor 36 overlying a source inversion region 40 and a drain conductor 38 overlying a drain inversion region 42. Source conductor 36 and drain conductor 38 are separated by channel region 44 which is further bounded by field oxide regions 24. Channel region 44 is controlled by an overlying gate conductor 54. Small voltage control diffusion regions 26 are formed adjacent source conductor 36 and drain conductor 38. Metal lines 58 provide a contact between voltage control diffusion regions 26 and off transistor circuitry. Similarly, metal contacts 60 are provided to source conductor 36 and drain conductor 38 respectively, while a metal contact 62 is provided to gate conductor 54.

Figure 2:
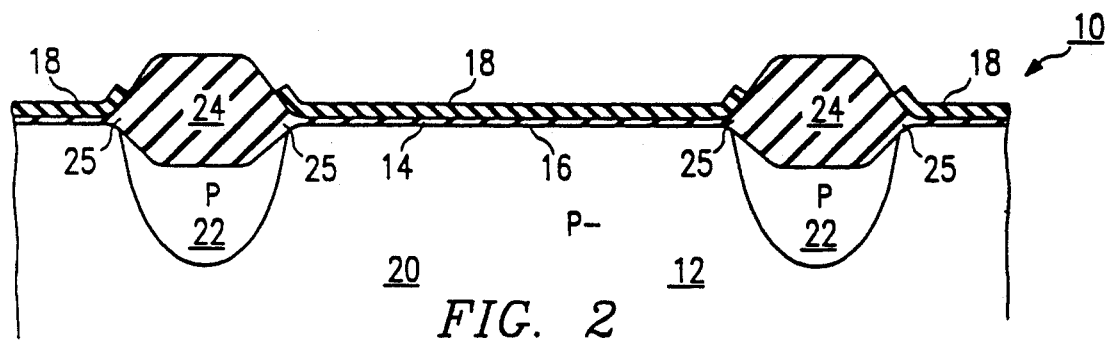
FIGS. 2 through 6 are greatly enlarged schematic elevational sectional views of a semiconductor workpiece showing progressive stages in the fabrication of a diffusionless MOSFET according to the invention.

The fabrication process is described by first referring to FIG. 2, which is a sectional view taken substantially along line 2—2 of FIG. 1. A semiconductor substrate or layer 10 is shown having a (p-) epitaxial layer 12 grown thereon. A layer 14 of oxide is deposited or grown on the surface 16 of (p-) region 12. This is followed by the deposition of a nitride layer 18 on top of the oxide layer 14. The nitride layer 18 is patterned and etched to define an active device area 20 over which it resides.

A boron implant at a dose of about $8 \times 10^{12}$ cm$^{-2}$ is performed to create (P) channel stop regions 22. Then thick field oxide regions 24 are thermally grown using a localized oxidation process to a thickness of approximately 9,000 Angstroms by exposing the substrate to steam at about 900° C. for several hours using any of several conventional techniques. The thermal oxide regions 24 grow beneath the edges of adjacent nitride layers 18, creating bird's beaks 25 instead of sharp transitions.

Nitride layer 18 and oxide layer 14 are then removed. At this point, in a first fabrication option, small voltage control diffusion regions 26a and 26b may be formed. A layer (not shown) of photoresist is deposited and patterned to act as an implant mask for an arsenic implant at a dose of about $6 \times 10^{15}$ cm$^{-2}$ and at an energy of about 135 KeV.

Figure 3:
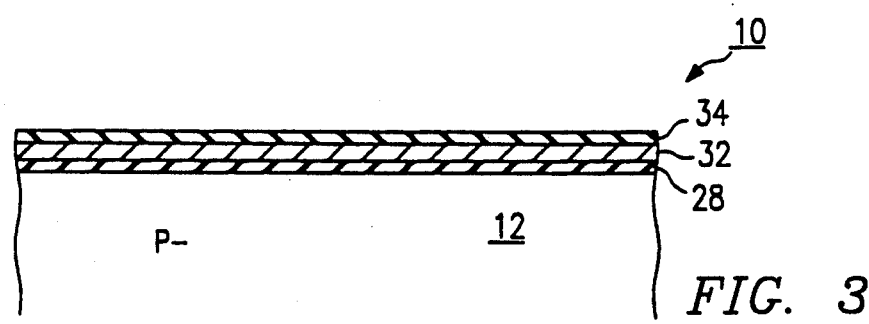
Figure 4:
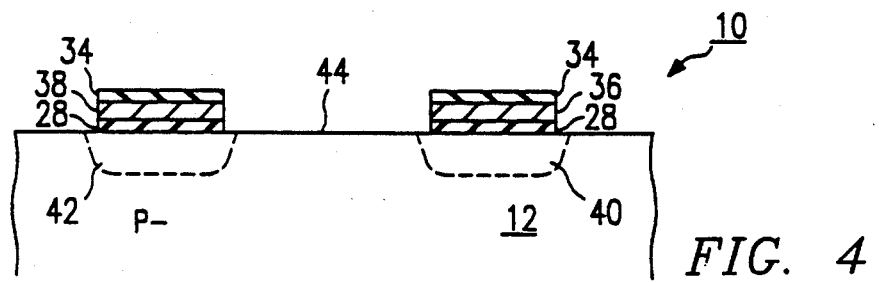
Figure 6:
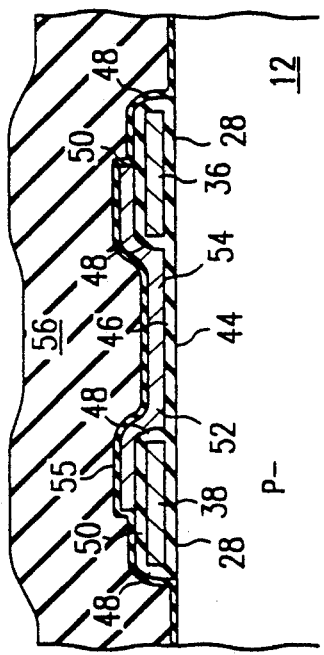
Figure 5:
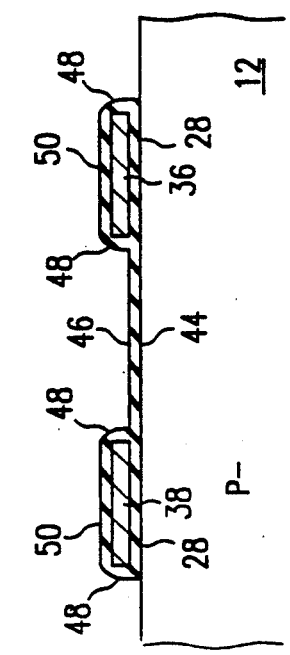

Referring next to FIG. 3, which is a sectional view corresponding to line 6—6 in FIG. 1, as are FIGS. 4, 5 and 6 to follow, a layer of oxide 28 (200–500 Å) is then grown across the surface of epitaxial layer 12. If the first fabrication option is selected, thick dopant enhanced oxide (2000–4000 Å) (see FIG. 1) will be grown on voltage control diffusion regions 26 during the formation of oxide layer 28.

A layer 32 of polycrystalline silicon (polysilicon) is deposited to a thickness of approximately 3,500 Angstroms. The polysilicon layer 32 (also known as the "poly 1" layer) is highly doped to render it conductive. This may be accomplished, for example, by exposing the polysilicon layer 32 to POCl$_3$ at 900° to 950° C. for approximately 15 minutes. After any oxide existing on the upper surface of polysilicon layer 32 has been removed, a layer 34 of oxide/nitride is then deposited across the face of poly 1 layer 32.

Referring next to FIG. 4, oxide/nitride layer 34 and poly 1 layer 32 are then patterned and etched to define a source conductor 36 and a drain conductor 38. Source conductor 36 overlies and defines a source inversion region 40 of epitaxial layer 12, while drain conductor 38 overlies a drain inversion region 42 of epitaxial layer 12. The approximate boundaries of these inversion regions are shown by dotted lines in FIGS. 1 and 4. Source conductor 36 and drain conductor 38 are spaced apart to define a channel region 44.

In a second alternative fabrication option, voltage control regions 26 can be formed at this point using the edges of source conductor 36 and drain conductor 38 for alignment. A layer of photoresist (not shown) is deposited and patterned to act as an implant mask for an arsenic implant at a dose of about $6 \times 10^{15}$ cm$^{-2}$ and at an energy of about 135 KeV. The resulting implanted regions 26 can then be "driven" under the edges of source conductor 36 and drain conductor 38 by heating the wafer at about 900° C. to 1000° C. for about an hour. If the first fabrication option has been selected, the terminal portions of source conductor 36 and drain conductor 38 have been disposed overlying respective portions of voltage control regions 26a and 26b.

Figure 4A:
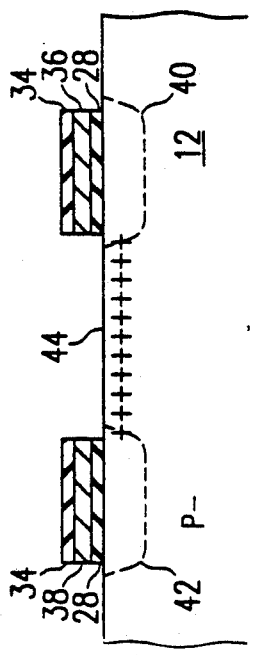
Figure 4B:
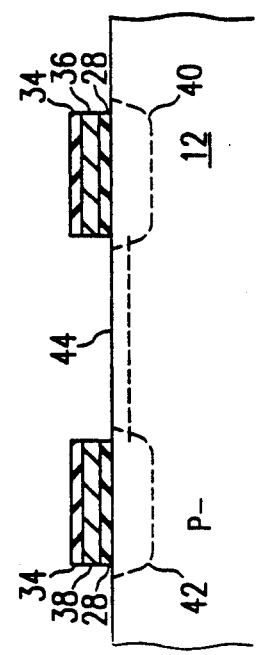

Next, an implant may be performed in channel region 44 of epitaxial layer 12. As will be discussed below during the description of the operation of the invention, this implant in the channel region 44 will control the current flow between the source inversion region 40 and the drain inversion region 42, the current flowing when the voltage applied to a future formed gate conductor exceeds a specified threshold voltage. For a high threshold voltage, a p-type implant, such as boron or another suitable Group III impurity, would be made at about 1 to $10 \times 10^{11}$ cm$^{-2}$ (FIG. 4a). For a low (or negative) threshold voltage, an n-type implant, such as phosphorus, arsenic or another suitable Group V impurity, at approximately 1 to $10 \times 10^{11}$ cm$^{-2}$ would be performed (FIG. 4b).

If an array of transistors were to be used as a read-only memory (ROM), the selection of threshold voltage would determine if a selected transistor would represent a logical "0" or a "1"; a high threshold voltage created for a "0" and a low (negative) threshold voltage created for a "1".

Referring next to FIG. 5, gate oxide 46 (200–400 Å) is grown across the surface of channel region 44. During the formation of gate oxide 46, oxides 48 grow on the edges of source conductor 36 and drain conductor 38. Additionally, oxide/nitride layer 34 is converted into an oxide/nitride/oxide layer 50.

Referring next to FIG. 6, a second polycrystalline silicon layer 52 ("poly 2") is next deposited over the face of the slice, and is highly doped to be (n+). Polycrystalline silicon layer 52 is then patterned and etched to form a gate conductor 54, which insulatively overlies channel region 44. After removing the photoresist, the wafer is oxidized to encapsulate the poly-2 layer 52 with oxide layer 55.

A borophosphosilicate (BPSG) glass layer 56 is then deposited over the face of the work piece. Windows are then opened to expose voltage control regions 26a and 26b, and metal lines 58a and 58b are formed using a standard method (see FIG. 1). Metal contacts 60a and 60b are made through the BPSG layer 56 to the source conductor 36 and the drain conductor 38 (see FIG. 1). Additionally, metal contacts 62 are made through the BPSG layer 56 to gate conductor 54 (see FIG. 1).

Figure 7:
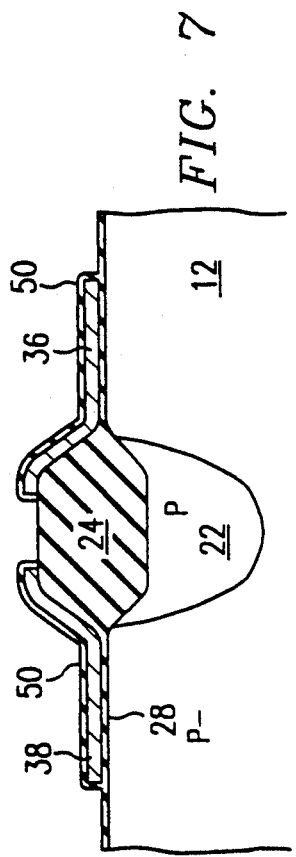
FIG. 7 is a sectional view of a completed MOSFET taken substantially along line 7—7 of FIG. 1, selected structure removed for clarity.

FIG. 7 is a sectional view of a completed device taken along line 7—7 of FIG. 1, selected structure such as BPSG layer 56 and metal lines 58 removed for clarity.

Figure 8:
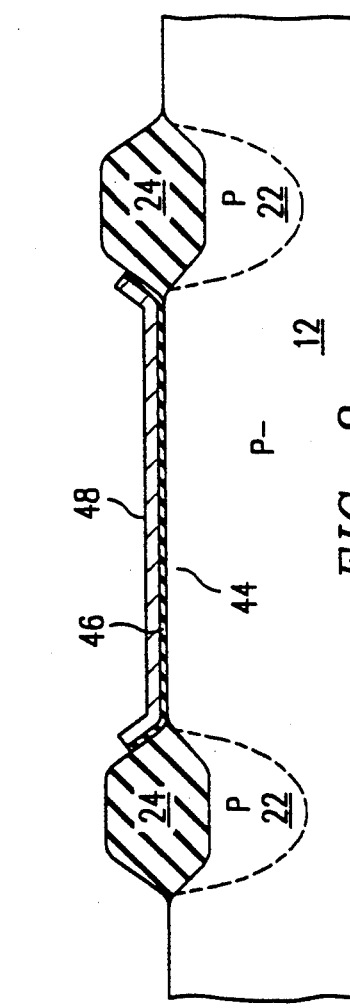
FIG. 8 is a sectional view of a completed MOSFET taken substantially along line 8—8 of FIG. 1 selected structure removed for clarity.

FIG. 8 is a sectional view taken substantially along the line 8—8 of FIG. 1. Selected structure such as BPSG layer 56 has been removed for clarity.

Figure 9:
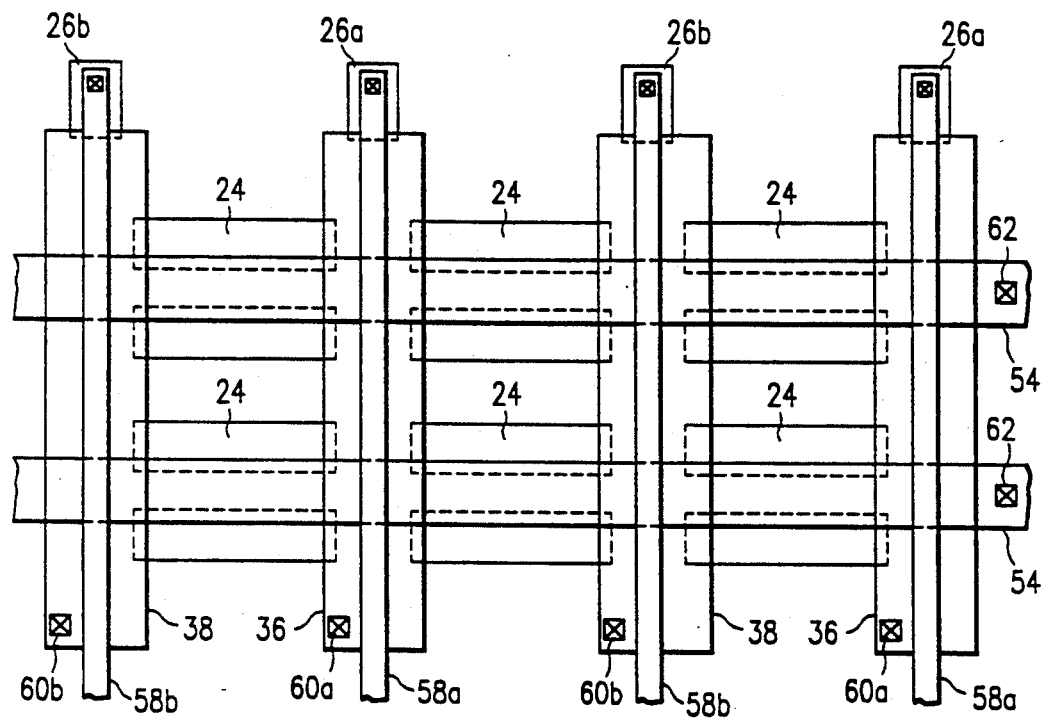
FIG. 9 is a plan view of a section of a memory cell array comprised of diffusionless MOSFETs according to the invention.

Referring next to FIG. 9, a plan view of a ROM memory cell array is shown, using diffusionless MOSFETs. FIG. 9 only depicts a portion of the memory array; selected structure of the array has been omitted for the sake of clarity. Source conductors 36 and drain conductors 38 are elongated bit lines that run in a vertical (y) direction in FIG. 9. Two gate conductors 54 are elongate in a horizontal (x) direction, each forming a wordline for a row of cells. One voltage control diffusion region 26 is shown for each source conductor 36 and drain conductor 38, and may be placed 8, 16, 32 or 64 word lines apart along the respective source or drain conductor. One metal contact 60 is also shown for each source conductor 36 and drain conductor 38; normally, only one metal contact 60 is required for each source or drain conductor in the array. Likewise, only one metal contact 62 is required for each gate conductor 54 in the array.

Figure 10:
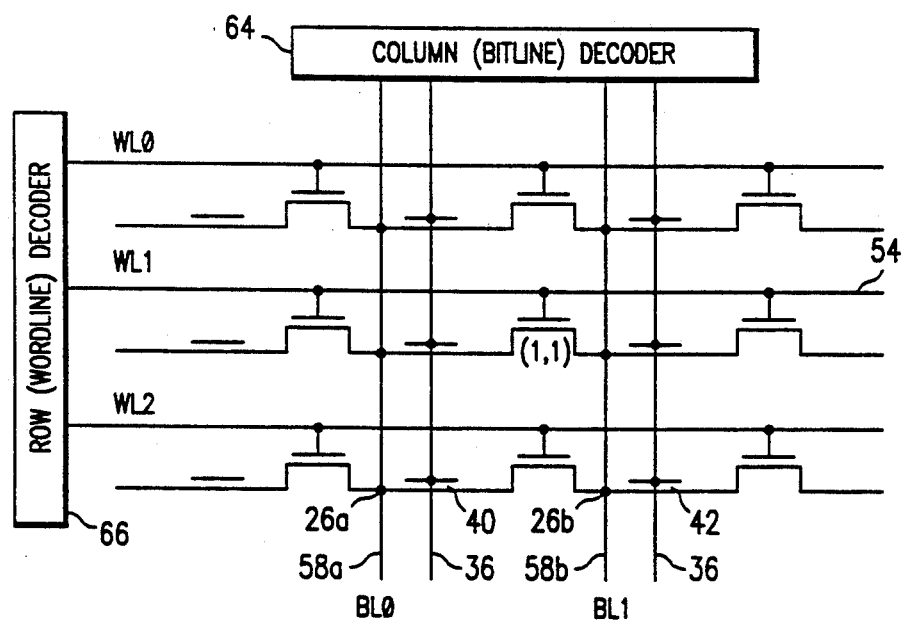
FIG. 10 is an electrical schematic diagram of a small section of an array of cells according to the invention.

FIG. 10 is an electrical schematic diagram of an array of ROM cells formed by columns and rows of transistors according to the invention (only 6 shown in FIG. 10). In FIGS. 1 through 10, like characters identify like parts so that the structural components of the ROM cells and their electrical representations may be compared. Each row of cells is provided with a wordline conductor WL0 or WL1, comprised of gate conductors 54. Each column of cells is provided with two bit lines such as BL0 and BL1, comprised of source conductors 36 and drain conductors 38.

Using cell (1,1) as designated in FIG. 10, as an example, operation of an array of ROM memory cells according to the invention will be described.

In a read-only memory (ROM), logical "zeroes" and "ones" are permanently encoded into the memory array. As discussed above, the encoding in this particular array is performed through implantation of boron, phosphorus or arsenic, into channel regions 44 during the fabrication process to control the threshold voltage of preselected cells. In the case of example cell (1,1), if a boron implant has been performed during fabrication, the threshold voltage for the respective channel region 44 is raised rendering the cell a logical "zero." If on the other hand, a phosphorus or arsenic implant has been performed, the threshold voltage is lowered, rendering the cell a logical "one."

It should be noted that while high threshold is achieved by boron implant, low threshold (near zero) can be realized without phosphorus implant if an epitaxial layer of suitable dopant concentration is used.

To read cell (1,1), the impedance of the channel is sensed. Column decoder 64 applies an inversion control voltage of approximately +5 volts to the drain conductor 38 and the source conductor 36 of the column containing cell (1,1). The application of an adequate inversion control voltage to the conductors creates inversion layers in the source inversion region 40 and drain inversion region 42 (FIGS. 1 and 4). In a P- epitaxial layer 12, these inversion layers approximate N+ diffusion regions of conventional MOSFETs.

A source voltage of approximately zero volts is applied to metal line 58a terminating in voltage control diffusion region 26a adjacent the source inversion region 40. A voltage of approximately +1 volt is applied to metal line 58b terminating in voltage control diffusion region 26b adjacent drain inversion region 42. A voltage difference is thereby created between the inversion layer in source inversion region 40, and the inversion layer in drain inversion region 42.

Row decoder 66 applies a gate voltage in the range of three to five volts to the elongated gate conductor 54 forming the row (wordline) containing the cell (1,1), in this case WL1. If channel region 44 of cell (1,1) has been implanted with boron, the gate voltage applied to gate conductor 54 will not exceed the threshold voltage of channel region 44, and an induced channel will not be formed, resulting in no current flow between the source inversion region 40 and the drain inversion region 42. No current will be detectable between metal lines 58a and 58b, indicating a logical "zero."

If on the other hand, a phosphorus or arsenic implant has been performed in channel region 44 of cell (1,1), the gate voltage will exceed the threshold voltage of channel region 44 and an induced channel will be formed allowing current flow between source inversion region 40 and drain inversion region 42. A current will be detectable between metal lines 58a and 58b indicating a logical "one."

Between adjacent bit lines, no locos is needed for electrical isolation as is customary in conventional structures. Here isolation is provided, when a deselected line 36 or 38 have zero voltage or no voltage on them.

Each bit line is shared by two adjacent bits. So in an array configuration, on the average, there is one bit line for a column of cells.

While preferred embodiments of the invention and their advantages have been set forth in the above detailed description, the invention is not limited thereto but only by the scope and spirit of the appended claims.

What is claimed is:

1. A source/drain diffusionless field effect transistor formed at the face of a semiconductor layer of a first conductivity type, comprising:
   a thin insulator layer overlying said semiconductor layer;
   a source conductor formed on said thin insulator layer overlie a source inversion region of said semiconductor layer;
   a drain conductor formed on said thin insulator layer to overlie a drain inversion region of said semiconductor layer and spaced from said first conductor,
   a channel region of said semiconductor layer defined between said source inversion region and said drain inversion region and further bounded by thick field oxide regions;
   a control gate conductor overlying said channel region; and
   at least one voltage source coupled to said drain conductor and said source conductor for inverting said source and drain inversion regions to a second conductivity type opposite said first conductivity type.

2. The transistor of claim 1, wherein the conductivity of said channel region is adjusted by an ion implant.

3. The transistor of claim 2, wherein said semiconductor layer comprises a P-type material and the conductivity of said channel region is enhanced with a phosphorus implant.

4. The diffusionless field effect transistor of claim 2, wherein said layer of semiconductor comprises a P-type material and the conductivity of said channel region is reduced with a boron implant.

5. The transistor of claim 1, and further comprising:
- a first diffused region of a second conductivity type opposite said first conductivity type formed in the face of said semiconductor layer, said first diffused region formed adjacent said source inversion region;
- a second diffused region of a second conductivity type opposite said first conductivity type formed in the face of said semiconductor layer, said second diffused region formed adjacent said drain inversion region;
- a source conductor line terminating in said first diffused region and coupled to said at least one voltage source; and
- a drain conductor line terminating in said second diffused region and coupled to said at least one voltage source.

6. The transistor of claim 1, wherein the conductivity of said channel region is adjusted by varying the thickness of said thin insulator layer.

7. An array of diffusionless field-effect transistors formed at a face of a semiconductor layer of a first conductivity type, comprising:
- a thin insulator layer overlying said layer of semiconductor;
- a plurality of parallel, elongated drain conductors formed overlying said thin insulator layer;
- for each pair of drain conductors, an elongated source conductor formed in between and substantially parallel thereto, each source conductor spaced from adjacent ones of said drain conductors by a plurality of channel regions, said channel regions having thick field oxide areas formed between channel regions of adjacent transistors; and
- a plurality of elongated gate conductors formed at an angle to insulatively intersect said source conductors and said drain conductors, said gate conductors insulatively disposed adjacent said channel regions, field effect transistors formed at least some intersections of said gate conductors with said source conductors, drain conductors and channel regions.

8. The array of claim 7, and further comprising:
- remote regions of said source conductors and said drain conductors disposed remotely from said channel regions, a plurality of diffused regions of a second conductivity type opposite said first conductivity type, disposed adjacent said remote regions; and
- a plurality of elongated metal contacts insulatively adjacent said source conductors and said drain contacting said diffused regions, at least one voltage source coupled to said contacts for inverting source and drain inversion regions from said first conductivity type to a second conductivity type opposite said first conductivity type.

9. An array of memory cells comprising source/drain diffusionless field effect transistors formed at a face of a semiconductor layer of a first conductivity type, comprising:
- a plurality of parallel, elongated drain conductors formed at said face;
- for each pair of drain conductors, an elongated source conductor formed in between and in parallel thereto, said source conductors and said drain conductors spaced by a plurality of channel regions, to form memory cells with a cell associated with each channel region;
- a plurality of rows of said cells formed at an angle to said source conductors and said drain conductors, a control gate conductor for each said row insulatively disposed adjacent said channel regions in said row and insulated from said source and drain conductors, so as to control the conductance of said channel regions; and
- a plurality of thick field oxide areas formed in the channel regions between adjacent ones of said rows to electrically isolate cells.

10. The array of claim 9, wherein the conductivity of preselected ones of said channel regions is reduced to form memory cells representing logical "0's."

11. The array of claim 9, wherein the conductivity of preselected ones of said channel regions is enhanced to form memory cells representing logical "1's."

12. The transistor of claim 1, including a channel stop region beneath each of said thick field oxide areas.

13. The transistor of claim 12, wherein said channel stop region includes a boron implant.

14. The transistor of claim 13, wherein said boron is implanted at a dose of about $8 \times 10^{12}$ cm$^{-2}$.

15. The transistor of claim 1, wherein sidewalls of said thick field oxide areas slope into said thin insulator layer in the form of a bird's beak.

16. The transistor of claim 9, including a channel stop region beneath each of said thick field oxide areas.

17. The transistor of claim 16, wherein said channel stop region includes a boron implant.

18. The transistor of claim 17, wherein said boron is implanted at a dose of about $8 \times 10^{12}$ cm$^{-2}$.

19. The transistor of claim 18, wherein sidewalls of said thick field oxide areas slope into said thin insulator layer in the form of a bird's beak.

* * * * *